United States Patent
Kijima et al.

(10) Patent No.: US 9,773,968 B2
(45) Date of Patent: Sep. 26, 2017

(54) PIEZOELECTRIC FILM, FERROELECTRIC CERAMICS AND INSPECTION METHOD OF PIEZOELECTRIC FILM

(71) Applicant: YOUTEC CO., LTD., Chiba (JP)

(72) Inventors: Takeshi Kijima, Chiba (JP); Yuuji Honda, Chiba (JP); Yukinori Tani, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 221 days.

(21) Appl. No.: 14/575,109

(22) Filed: Dec. 18, 2014

(65) Prior Publication Data
US 2015/0183190 A1    Jul. 2, 2015

(30) Foreign Application Priority Data
Dec. 27, 2013 (JP) .................................. 2013-272681

(51) Int. Cl.
| | | |
|---|---|---|
| *G01N 23/207* | (2006.01) | |
| *H01L 41/187* | (2006.01) | |
| *H01L 41/08* | (2006.01) | |
| *H01L 41/319* | (2013.01) | |
| *C04B 35/491* | (2006.01) | |

(52) U.S. Cl.
CPC ........ *H01L 41/1876* (2013.01); *C04B 35/491* (2013.01); *H01L 41/0815* (2013.01); *H01L 41/319* (2013.01); *C04B 2235/787* (2013.01)

(58) Field of Classification Search
CPC .... G01N 23/20; G01N 23/207; H01L 41/187; H01L 41/1876; H01L 41/00; C01G 25/006; C01G 2307/20; B32B 18/00; B32B 2307/20
USPC .......................................................... 378/78
See application file for complete search history.

(56) References Cited

U.S. PATENT DOCUMENTS 8,148,878 B2 *   4/2012   Maekawa .......... G01C 19/5607
                                                    310/357
9,293,688 B2 *   3/2016   Suenaga ................. H01L 41/18

FOREIGN PATENT DOCUMENTS

WO      2006/087777      8/2006

* cited by examiner

*Primary Examiner* — Jurie Yun
(74) *Attorney, Agent, or Firm* — Wenderoth, Lind & Ponack, L.L.P.

(57) ABSTRACT

To obtain a piezoelectric film having excellent piezoelectric properties. An aspect of the present invention is a piezoelectric film having a crystal oriented in the c-axis direction and a crystal oriented in the a-axis direction, in which, when denoting the amount of a (004) component of the crystal oriented in the c-axis direction by C and denoting the amount of a (400) component of the crystal oriented in the a-axis direction by A, the piezoelectric film satisfies a formula 1 below.

$$C/(A+C) \geq 0.1 \qquad \text{formula 1}$$

20 Claims, 2 Drawing Sheets

PZT
$\alpha, \beta, \gamma \neq 90°$

PIEZOELECTRIC FILM, FERROELECTRIC CERAMICS AND INSPECTION METHOD OF PIEZOELECTRIC FILM

BACKGROUND OF THE INVENTION

Field of the Invention

The present invention relates to a piezoelectric film, ferroelectric ceramics and an inspection method of a piezoelectric film.

Description of a Related Art

A conventional manufacturing method of $Pb(Zr,Ti)O_3$ (hereinafter, referred to as "PZT") perovskite-type ferroelectric ceramics will be explained.

A $SiO_2$ film having a thickness of 300 nm is formed on a 4-inch Si wafer, and a $TiO_X$ film having a thickness of 5 nm is formed on the $SiO_2$ film. Next, for example, a Pt film having a thickness of 150 nm oriented in (111) is formed on the $TiO_X$ film, and a PZT sol-gel solution is applied onto the Pt film by using a spin coater. Spin conditions at this time are such that the wafer is rotated at a rotation rate of 1500 rpm for 30 seconds and is rotated at a rotation rate of 4000 rpm for 10 seconds.

Next, the applied PZT sol-gel solution is heated and held on a hot plate at 250° C. for 30 seconds to be dried, and moisture is removed, and then it is further heated and held on a hot plate maintained at a high temperature of 500° C. for 60 seconds to thereby be subjected to temporary calcination. A PZT amorphous film having a thickness of 150 nm is generated by repeating this several times.

Subsequently, the PZT amorphous film is subjected to an annealing treatment at 700° C. by using a pressurizing-type lamp annealing device (RTA: rapidly thermal anneal) to carry out PZT crystallization. The PZT film thus crystallized is constituted of a perovskite structure (for example, refer to Patent Literature 1).

[Patent Literature 1] WO 2006/087777

SUMMARY OF THE INVENTION

A PZT film having been formed on a substrate and crystallized has, as shown in FIG. 4, a crystal structure in which axis lengths of three axes are equal (a=b=c) and three angles formed by two axes are not equal ($\angle\alpha \neq \angle\beta \neq \angle\gamma$), and a c-axis is the longest axis. The PZT film has a crystal oriented in the c-axis direction (a crystal in which the c-axis is positioned in the perpendicular direction relative to the substrate surface) and a crystal oriented in the a-axis direction (a crystal in which the a-axis is positioned in the perpendicular direction relative to the substrate surface). When the PZT film is used as a piezoelectric element in which an electric field is applied in the direction perpendicular to the substrate surface in the PZT film to thereby be caused to move in the direction parallel to the substrate surface (hereinafter, referred to as a "piezoelectric element for extracting d31"), a smaller amount of the crystal oriented in the c-axis direction results in lowering properties of the piezoelectric element for extracting d31. In other words, a larger amount of the crystal oriented in the a-axis direction results in lowering properties of the piezoelectric element for extracting d31.

Note that "the direction perpendicular to the substrate surface" means including not only the direction completely perpendicular to the substrate surface but also direction that shifts by within 20 degrees from the direction completely perpendicular to the substrate surface. In addition, "the direction completely parallel to the substrate surface" means including not only the direction parallel to the substrate surface but also direction that shifts by within 20 degrees from the direction completely parallel to the substrate surface.

From the above, it can be said that, in the case where a piezoelectric film other than the PZT film is also used as a piezoelectric element for extracting d31, a smaller amount of a crystal oriented in the c-axis direction results in lowering properties of the piezoelectric element for extracting d31.

An aspect of the present invention is to enhance properties of a piezoelectric element for extracting d31 by increasing the amount of a crystal oriented in the c-axis direction in the piezoelectric film.

In addition, an aspect of the present invention is to evaluate properties of a piezoelectric element for extracting d31 by measuring the amount of a crystal oriented in the c-axis direction in the piezoelectric film.

Hereinafter, various aspects of the present invention will be explained.

[1] A piezoelectric film comprising a crystal oriented in a c-axis direction and a crystal oriented in an a-axis direction, wherein, when denoting an amount of a (004) component of the crystal oriented in the c-axis direction by C and denoting an amount of a (400) component of the crystal oriented in the a-axis direction by A, the piezoelectric film satisfies a formula 1 below.

$C/(A+C) \geq 0.1$ (preferably, $C/(A+C) \geq 0.20$, more preferably $C/(A+C) \geq 0.25$, further more preferably $C/(A+C) \geq 0.33$)  formula 1

[2] The piezoelectric film according to the above [1], wherein $2\theta_{004}$ in a result of XRD of the (004) component of the crystal oriented in the c-axis direction satisfies formula 2 below.

$95° < 2\theta_{004} < 102°$  formula 2

[3] The piezoelectric film according to the above [1], wherein a $d_{004}$ value in a result of XRD of the (004) component of the crystal oriented in the c-axis direction satisfies a formula 3 below.

$0.9919 < d_{004} < 1.0457$  formula 3

[4] The piezoelectric film according to any one of the above [1] to [3], wherein the piezoelectric film is a PZT film, and a c-axis length satisfies formula 4 below.

$0.39678$ nm $< c$-axis length $< 0.41825$ nm  formula 4

[5] A ferroelectric ceramics, including:
a first stacked film; and
the piezoelectric film according to any one of the above [1] to [4] formed on the first stacked film,
wherein:
the first stacked film is a film in which a first $ZrO_2$ film and an $XO_Y$ film are formed sequentially and repeatedly N times and a second $ZrO_2$ film is formed on the film formed repeatedly N times;
the X is Ca, Mg or Hf;
the Y is 1 or 2; and
the N is an integer of 1 or more.

[6] The ferroelectric ceramics according to the above [5], comprising a second stacked film obtained by stacking a $SrTiO_3$ film and a $SrRuO_3$ film, or a $SrTiO_3$ film or a $SrRuO_3$ film, formed between the first stacked film and the piezoelectric film.

Note that the second stacked film means including both a stacked film in which a $SrRuO_3$ film is formed on a $SrTiO_3$ film and a stacked film in which a $SrTiO_3$ film is formed on a $SrRuO_3$ film.

[7] A ferroelectric ceramics comprising:

a third stacked film in which a first $ZrO_2$ film, an $Y_2O_3$ film and a second $ZrO_2$ film are stacked sequentially;

a second stacked film obtained by stacking a $SrTiO_3$ film and a $SrRuO_3$ film, or a $SrTiO_3$ film or a $SrRuO_3$ film, formed on said third stacked film; and a piezoelectric film according to any one of the above [1] to [4] formed on said second stacked film or the $SrTiO_3$ film or the $SrRuO_3$ film.

[8] The ferroelectric ceramics according to the above [5] or [6], wherein a third stacked film obtained by stacking a $ZrO_2$ film and an $Y_2O_3$ film is formed under said first stacked film, or between said first stacked film and said piezoelectric film.

[9] The ferroelectric ceramics according to the above [6] or [7], wherein a lead titanate film is formed between said second stacked film or $SrTiO_3$ film or $SrRuO_3$ film and said piezoelectric film.

[10] The ferroelectric ceramics according to any one of the above [5], [6] and [8], including an electrode film formed between said first stacked film and said piezoelectric film.

[11] The ferroelectric ceramics according to the above [10], wherein said electrode film is in contact with said first stacked film.

[12] The ferroelectric ceramics according to the above [7], comprising an electrode film formed between said third stacked film and said second stacked film or $SrTiO_3$ film or $SrRuO_3$ film.

[13] The ferroelectric ceramics according to any one of the above [10] to [12], wherein said electrode film includes an oxide or a metal.

[14] The ferroelectric ceramics according to any one of the above [10] to [12], wherein said electrode film is a Pt film or an Ir film.

[15] The ferroelectric ceramics according to any one of the above [5], [6], [8], [10] and [11], wherein said first stacked film is formed on a Si substrate.

[16] The ferroelectric ceramics according to the above [7] or [12], wherein said third stacked film is formed on a Si substrate.

[17] An inspection method of a piezoelectric film, comprising the steps of:

measuring each of a (004) component of a crystal oriented in a c-axis direction and a (400) component of a crystal oriented in an a-axis direction of the piezoelectric film by XRD that uses a multilayer film mirror;

detecting an amount C of said (004) component and an amount A of said (400) component from said measurement result; and determining from said detection result that the piezoelectric film has excellent piezoelectric properties when a formula 1 below is satisfied, or that the piezoelectric film does not have excellent piezoelectric properties when the formula 1 below is not satisfied, $C/(A+C) \geq 0.1$            formula 1.

[18] The inspection method of a piezoelectric film according to the above [17], wherein the method determines that the piezoelectric film has excellent piezoelectric properties when $2\theta_{004}$ in a result of XRD of said (004) component of the crystal oriented in the c-axis direction satisfies a formula 2 below, or that the piezoelectric film does not have excellent piezoelectric properties when $2\theta_{004}$ does not satisfy the formula 2 below, $95° < 2\theta_{004} < 102°$            formula 2.

[19] The inspection method of a piezoelectric film according to the above [17], wherein the method determines that the piezoelectric film has excellent piezoelectric properties when a $d_{004}$ value in a result of XRD of said (004) component of the crystal oriented in the c-axis direction satisfies a formula 3 below, or that the piezoelectric film does not have excellent piezoelectric properties when a $d_{004}$ value does not satisfy the formula 3 below, $0.9919 < d_{004} < 1.0457$            formula 3.

[20] The inspection method of a piezoelectric film according to any one of the above [17] to [19], wherein said piezoelectric film is a 1=film, and the method determines that the piezoelectric film has excellent piezoelectric properties when a c-axis length satisfies a formula 4 below, or that the piezoelectric film does not have excellent piezoelectric properties when a c-axis length does not satisfy the formula 4 below, $0.39678$ nm $< c$-axis length $< 0.41825$ nm            formula 4.

Note that, in above-described various aspects of the present invention, the phrase of "forming a specified B (hereinafter, referred to as "B") on (or under) a specified A (hereinafter, referred to as "A") (or "B" is formed on (or under) "A") is not limited to the case of "forming "B" (the case where "B" is formed) directly on (or under) "A"," but the phrase also includes the case of "forming "B" (the case where "B" is formed) over (or below) "A" via another substance within the scope not hindering the working effect of the present invention."

According to one aspect of the present invention, properties of a piezoelectric element for extracting d31 can be enhanced by increasing the amount of a crystal oriented in the c-axis direction in a piezoelectric film.

Furthermore, according to another aspect of the present invention, properties of a piezoelectric element for extracting d31 can be evaluated by measuring the amount of a crystal oriented in the c-axis direction in a piezoelectric film.

DESCRIPTION OF THE PREFERRED EMBODIMENTS

Hereinafter, embodiments and Examples of the present invention will be explained in detail using the drawings. However, a person skilled in the art would be able to easily understand that the present invention is not limited to the following explanation but the configuration and details thereof can be changed variously without deviating from the gist and the range of the present invention. Accordingly, the present invention should not be construed as being limited to the description of the present embodiments and Examples shown below.

First Embodiment

Figure 1:
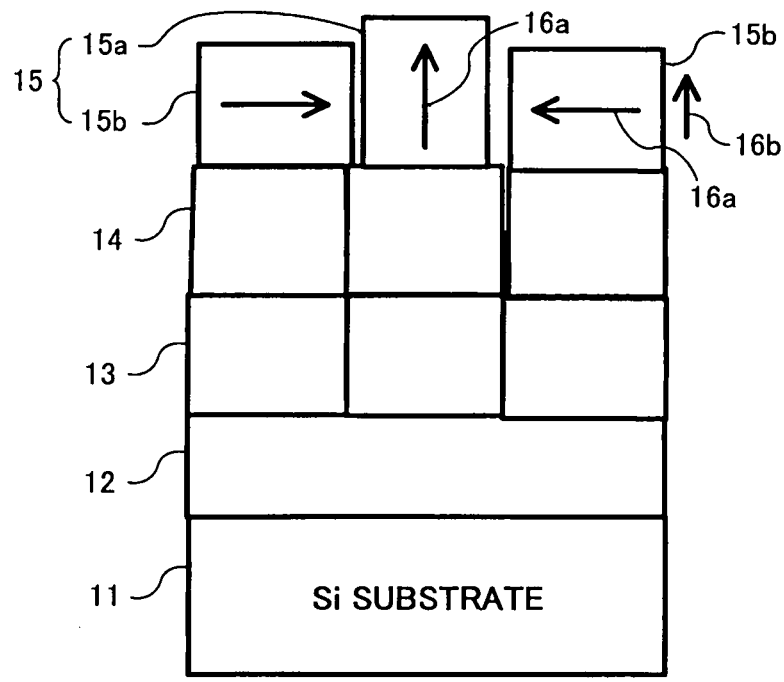
FIG. 1 is a schematic cross-sectional view explaining a manufacturing method of the ferroelectric ceramics according to an aspect of the present invention.
Figure 2:
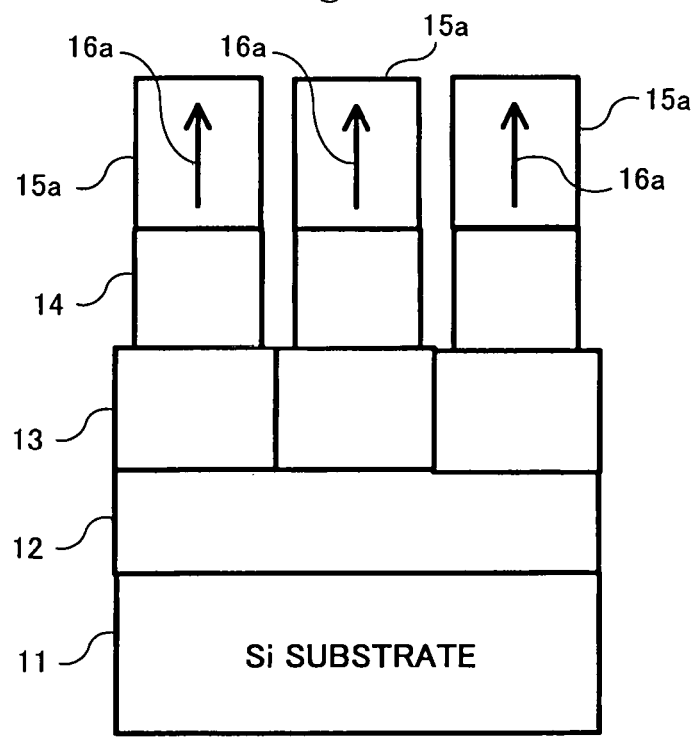
FIG. 2 is a schematic cross-sectional view explaining a manufacturing method of the ferroelectric ceramics according to an aspect of the present invention.

FIGS. 1 and 2 are schematic cross-sectional views explaining a manufacturing method of the ferroelectric ceramics according to an aspect of the present invention. Each of a Pt film 13, a SrTiO$_3$ film 14, and a PZT film 15 as an example of a piezoelectric film oriented in the c-axis direction shown in FIGS. 1 and 2 is shown schematically for every crystal.

As shown in FIG. 1, a first stacked film is formed on a Si substrate 11 having a (100) crystal plane. The first stacked film is a film formed by repeating sequentially N times a first ZrO$_2$ film and an XO$_Y$ film and obtained by forming a second ZrO$_2$ film on the film formed by repeating these N times. X is Ca, Mg or Hf, Y is 1 or 2, and N is an integer of 1 or more. Note that an oxide film such as a SiO$_2$ film or a TiO$_2$ film may be formed on the (100) crystal plane of the Si substrate 11.

Hereinafter, an example of a formation method of the first stacked film 12 will be explained in detail. The Si substrate 11 is heated to 700° C. or more (preferably 800° C. or more), and the Si substrate 11 is set in a prescribed vacuum atmosphere. Subsequently, Zr is evaporated by an evaporation method by electron beams using an evaporation material of a Zr single crystal, and the evaporated Zr reacts with oxygen on the (100) crystal plane of the Si substrate 11 heated at 700° C. or more to thereby be formed into a ZrO$_2$ film. Subsequently, X (Ca or Mg or Hf) is evaporated by an evaporation method by an electron beams using an evaporation material of X, and the evaporated X reacts with oxygen on the ZrO$_2$ film of the Si substrate 11 heated at 700° C. or more to thereby be formed into an XO$_Y$ film. Subsequently, Zr is evaporated by an evaporation method by electron beams using an evaporation material of a Zr single crystal, and the evaporated Zr reacts with oxygen on the XO$_Y$ film of the Si substrate 11 heated at 700° C. or more to thereby be formed into a ZrO$_2$ film. As described above, the first stacked film 12 in which the ZrO$_2$ film, the XO$_Y$ film and the ZrO$_2$ film are stacked is formed, and the first stacked film 12 is oriented in (100) in the same way as the (100) crystal plane of the Si substrate 11. It is preferable that the first stacked film 12 has a film thickness of 2 nm to 100 nm (preferably 10 nm to 50 nm), and the film is a film having an extremely high single crystallinity.

Note that, in the present embodiment, the first stacked film 12 is formed on the Si substrate 11, but the first stacked film 12 is not limiting, and a (100) orientation film other than the first stacked film may be formed on the Si substrate 11. The (100) orientation film referred herein means a film that is oriented in (100) in the same way as the (100) crystal plane of the Si substrate 11.

Furthermore, in the present embodiment, the first stacked film 12 is formed on the Si substrate 11, but an XSZ (X: Ca or Mg or Hf) film may be formed on the Si substrate 11, in place of the first stacked film 12. In this case, by evaporating a Zr single crystal and X (Ca or Mg or Hf) by an evaporation method by electron beams using an evaporation material of a Zr single crystal and X, materials of the evaporated Zr single crystal and X react with oxygen on the Si substrate 11 heated at 700° C. or more to thereby become an oxide and the XSZ film is formed on the Si substrate 11. The XSZ film is oriented in (100) in the same way as the (100) crystal plane of the Si substrate 11. The XSZ film is a film having an extremely high single crystallinity. The thickness of the XSZ film is preferable to be 2 nm to 100 nm (preferably 10 nm to 50 nm).

Note that, in the present specification, the "XSZ film" means a film formed, for example, by adding Ca, Mg, Hf or the like in zirconia (ZrO$_2$) in an amount of approximately 4 to 15%, or a film in a stable state formed of a mixture of XO$_Y$ and ZrO$_2$ that are products of the oxidation of X and Zr by oxygen, and further includes a film in which the stacked film obtained by stacking ZrO$_2$ film and XO$_Y$ film forms a mixture of XO$_Y$ and ZrO$_2$ by thermal diffusion. The XSZ is superior in mechanical properties such as strength and toughness to oxide-free zirconia. This is because the propagation of a crack that causes destruction is inhibited by a phase transformation from a tetragonal crystal to a monoclinic crystal and thus the stress concentration at the tip of the crack is alleviated. This unique mechanism is referred to as a "stress-induced phase transformation strengthening mechanism," and at most about 40% of a tetragonal crystal transforms to a monoclinic crystal.

In addition, in the present embodiment, the first stacked film 12 is formed on the Si substrate 11, but the present embodiment may be executed by modification so that a third stacked film obtained by stacking sequentially the first ZrO$_2$ film, an Y$_2$O$_3$ film and the second ZrO$_2$ film is to be formed on the Si substrate 11 in place of the first stacked film 12. Furthermore, the present embodiment may be executed by modification so that the third stacked film is formed on the Si substrate 11 and, the first stacked film 12 is formed on the third stacked film, or the present embodiment may be executed so that the first stacked film 12 is formed on the Si substrate 11 and the third stacked film is formed on the first stacked film 12. In this case, as the formation method of the third stacked film, there may be used a method, in which "Y" is used in place of "X (Ca or Mg or Hf)" in the above-described formation method of the first stacked film 12.

Moreover, in executing the above-described modification, the third stacked film is formed on the Si substrate 11, but in place of the third stacked film, a YSZ film may be formed on the Si substrate 11. In this case, by an evaporation method by electron beams using an evaporation material of a Zr single crystal and Y, the Zr single crystal and Y is evaporated and materials of the evaporated Zr single crystal and Y react with oxygen on the Si substrate 11 heated at 700° C. or more to thereby become oxides and a YSZ film is formed on the Si substrate 11. The YSZ film is oriented in (100) in the same way as the (100) crystal plane of the Si substrate 11. The YSZ film is a film having an extremely high single crystallinity. In addition, the thickness of the YSZ film may be 2 nm to 100 nm (preferably 10 nm to 50 nm).

Note that, in the present specification, the "YSZ film" is referred to as a film in a stable state formed of a mixture of Y$_2$O$_3$ and ZrO$_2$ obtained by the oxidation of Y and Zr by oxygen, and also includes a film in which the stacked film obtained by stacking a ZrO$_2$ film and an Y$_2$O$_3$ film is changed into a mixture of Y$_2$O$_3$ and ZrO$_2$ by thermal diffusion. In a broad sense, the "YSZ film" is a substance in which several % of Y$_2$O is mixed in ZrO$_2$ (in order to stabilize the oxidation number of Zr) and is a well known substance in which 8% of Y$_2$O is added, or a substance obtained by oxidizing an alloy in which several % of Y is added to Zr and is also a well known substance obtained by oxidizing an alloy in which 8% of Y is added to Zr.

An example of the lattice constant of Si is 0.543 nm.

After forming the first stacked film 12 as described above, a Pt film 13 by epitaxial growth is formed on the first stacked film 12. The Pt film 13 is oriented in (100) in the same way as the first stacked film 12. The Pt film 13 may function as an electrode film. Note that the Pt film 13 may be an electrode film other than a Pt film. The electrode film may be an electrode film constituted of, for example, an oxide or metal, or may be a Pt film or an Ir film.eb;normal In addition, an example of the lattice constant of Pt is 0.3923 nm.

Next, a SrTiO$_3$ film 14 is formed on the Pt film 13 by sputtering. Conditions of the sputtering film formation at this time are as follows.

Film formation pressure: 4 Pa
Film formation substrate temperature: ordinary temperature
Gas in film formation: Ar
Ar flow rate: 30 sccm
RF output: 300 W (13.56 MHz power source)
Film formation time: 6 minutes (thickness 50 nm)
Target: SrTiO$_3$ sintered body After that, the SrTiO$_3$ film 14 is crystallized by RTA (Rapid Thermal Anneal) under a pressurized oxygen atmosphere. Conditions of RTA at this time are as follows.

Annealing temperature: 600° C.
Introduced gas: oxygen gas
Pressure: 9 kg/cm$^2$
Temperature rising rate: 100° C./sec
Annealing time: 5 minutes The SrTiO$_3$ film 14 is formed of a complex oxide of strontium and titanium, and formed of a compound having a perovskite structure.

An example of the lattice constant of SrTiO$_3$ is 0.3905 nm. Note that the crystal of SrTiO$_3$ has a die (cube)-like shape.

Note that, in the present embodiment, the SrTiO$_3$ film 14 is formed on the Pt film 13, but a SrRuO$_3$ film in place of the SrTiO$_3$ film 14 may be formed on the Pt film 13 by sputtering. The SrRuO$_3$ film is formed of a complex oxide of strontium and ruthenium, and formed of a compound having a perovskite structure.

Furthermore, in the present embodiment, the SrTiO$_3$ film 14 is formed on the Pt film 13, but, in place of the SrTiO$_3$ film 14, the second stacked film obtained by stacking a SrTiO$_3$ film and a SrRuO$_3$ film may be formed on the Pt film 13.

Subsequently, a PZT amorphous film that is short of lead, or a PZT amorphous film of a stoichiometric composition is formed on the SrTiO$_3$ film 14, and by subjecting the PZT amorphous film to a heat treatment in a pressurized oxygen atmosphere, the PZT film 15 obtained by crystallizing the PZT amorphous film is formed on the SrTiO$_3$ film 14. Note that it is preferable that the amount of lead in the PZT amorphous film that is short of lead is 80 atom % or more to 95 atom % or less, when the amount of lead in the case where a PZT amorphous film has a stoichiometric composition is defined as 100 atom %.

Hereinafter, an example of formation method of the PZT film 15 will be explained in detail.

There was used, as a sol-gel solution for forming a PZT film, an E1 solution containing butanol as a solvent, being obtained by adding lead in an amount being short by 70% to 90% and having a concentration of 10% by weight.

An alkaline alcohol having an amino group, referred to as dimethylamino ethanol, was added to the sol-gel solution, at a ratio of E1 sol-gel solution:dimethylamino ethanol=7:3 in a volume ratio, which exhibited strong alkalinity of pH=12.

A PZT amorphous film was formed using the above-described solution by spin coating. MS-A200 manufactured by MIKASA CO., LTD. was used as a spin coater. First, the coater was rotated at 800 rpm for 5 seconds and at 1500 rpm for 10 seconds, and then the rotation rate was raised gradually to 3000 rpm in 10 seconds, which was allowed to stand on a hot plate (AHS-300, a ceramic hot plate manufactured by AS ONE Corporation) at 150° C. for 5 minutes in the air, and after that, was allowed to stand on a hot plate (AHS-300) at 300° C. for 10 minutes also in the air, and then was cooled to room temperature. A PZT amorphous film having an intended thickness of 200 nm was formed on the SrTiO$_3$ film 14 by repeating the process five times. The product was formed in plural number.

Then, the PZT film 15 obtained by crystallizing the above-described PZT amorphous film is formed on the SrTiO$_3$ film 14 by subjecting the PZT amorphous film to a heat treatment in a pressurized oxygen atmosphere. Note that an example of the lattice constant of PZT is 0.401 nm.

The PZT film 15 has a crystal 15a oriented in a c-axis direction 16a and a crystal 15b oriented in an a-axis direction 16b. The axis length of the c-axis is longer than the axis length of the a-axis by approximately 6%. Furthermore, it is preferable that the c-axis length satisfy a formula 4 below. Thereby, the amount or the ratio of the crystal 15a oriented in the c-axis direction 16a can be increased. Note that the numerical values in the formula 4 below are values obtained by experiments.

$$0.39678 \text{ nm} < c\text{-axis length} < 0.41825 \text{ nm} \quad \text{formula 4}$$

After forming the PZT film 15 as described above, plasma is formed in a position facing the PZT film 15 and thus the PZT film 15 subjected to a polling treatment. Thereby, as shown in FIG. 2, the amount of the (004) crystal 15a oriented in the c-axis direction 16a in the PZT film 15 can be increased.

When denoting the amount of (004) component of the crystal 15a oriented in the c-axis direction 16a in the PZT film 15 by C, and the amount of (400) component of the crystal 15b oriented in the a-axis direction 16b in the PZT film 15 by A, it is preferable that these satisfy the formula 1 below. Note that the numerical values in the formula 1 below are values obtained empirically.

$$C/(A+C) \geq 0.1 \text{ (preferably, } C/(A+C) \geq 0.20, \text{ more preferably, } C/(A+C) \geq 0.25, \text{ further more preferably, } C/(A+C) \geq 0.33) \quad \text{formula 1}$$

Note that, in the present specification, "oriented in the c-axis direction" means that the c-axis exists in the direction (orientation direction) perpendicular to the substrate surface (orientation plane), and "oriented in the a-axis direction" means that the a-axis exists in the direction (orientation direction) perpendicular to the substrate surface (orientation plane). The "perpendicular direction (orientation direction)" mentioned here means that it includes not only the direction completely perpendicular to the substrate surface (orientation plane) but also directions shifted by within 20° from the direction completely perpendicular to the substrate surface.

It is preferable that $2\theta_{004}$ as the result of measurement of the (004) component of the crystal oriented in the c-axis direction in the PZT film 15 by XRD (X-Ray Diffraction) satisfies the formula 2 below. Thereby, the amount or the ratio of the crystal 15a oriented in the c-axis direction 16a can be increased. Note that the numerical values in the formula 2 below are values obtained by experiments.

$$95° < 2\theta_{004} < 102° \quad \text{formula 2}$$

By satisfying the formula 2, the PZT film 15 is put into a polarized state even when a polling treatment is not performed.

Furthermore, it is preferable that a $d_{004}$ value in the result of XRD of the (004) component of the crystal oriented in the c-axis direction in the PZT film 15 satisfies the formula 3 below. Thereby, the amount or the ratio of the crystal 15a oriented in the c-axis direction 16a can be increased. Note that the numerical values in the formula 3 are values obtained by experiments.

$$0.9919 < d_{004} < 1.0457 \quad \text{formula 3}$$

By satisfying the formula 3, the PZT film 15 is put into a polarized state even when a polling treatment is not performed.

According to the present embodiment, since the SrTiO$_3$ film 14 having a lattice constant close to the axis length of the a-axis of PZT is disposed between the PZT film 15 and the Pt film 13, the amount or the ratio of the crystal 15a oriented in the c-axis direction 16a in the PZT film 15 can be increased. As the result, piezoelectric properties can be enhanced when the PZT film 15 is used as a piezoelectric element for extracting d31, in which an electric field is applied in the direction perpendicular to the Si substrate 11 surface in the PZT film 15 to thereby be caused to move in the direction parallel to the Si substrate 11 surface.

It is considered that, since each thickness of the first stacked film 12, the Pt film 13 and the PZT film 15 is several tens nm to several μm but the thickness of the Si substrate 11 is as thick as approximately 500 μm and the lattice constant of Si is larger than the lattice constant of each of Pt and PZT, the Si substrate 11 may give an influence of widening the axis length of a Pt crystal in the direction parallel to the substrate surface of the Pt film 13. It is considered that the influence may increase the amount or the ratio of the (400) crystal 15b oriented in the a-axis direction 16b in the PZT film 15. The reason therefor is that, since the axis length of the c-axis is longer than the axis length of the a-axis by approximately 6%, formation of the (400) crystal 15b oriented in the a-axis direction 16b is more stable energetically than formation of the (004) crystal 15a oriented in the c-axis direction 16a.

In contrast, it is possible to give an influence contrary to the influence of widening the axis length of a Pt crystal (that is, to absorb the influence of widening the axis length of a Pt crystal) by the SrTiO$_3$ film 14 having a lattice constant close to the axis length of the PZT a-axis, and, as the result, the amount or the ratio of the crystal 15a oriented in the c-axis direction 16a in the PZT film 15 can be increased. The reason therefor is that SrTiO$_3$ is a crystal of the cubic system in which all axis lengths are equal, and even if the orientation direction is shifted, SrTiO$_3$ can give the above-described contrary influence.

Furthermore, according to the present embodiment, since a PZT amorphous film that is short of lead or a PZT amorphous film of a stoichiometric composition is used in forming the PZT film 15, the amount or the ratio of the crystal 15a oriented in the c-axis direction 16a in the PZT film 15 can be increased. The reason therefor is that, when a PZT amorphous film obtained by adding excess lead is used, PbO is formed in the PZT film in crystallization due to the excess lead and a crystal oriented in the a-axis direction is easily formed on the PbO, whereas the formation of PbO is suppressed in the crystallization by using a PZT amorphous film that is short of lead and thus the amount or the ratio of a crystal oriented in the a-axis direction can be lowered. For example, it is confirmed that, in contrast to denoting the amount of lead by 100 atom % in the case where a PZT amorphous film has a stoichiometric composition, the use of a PZT amorphous film in which the lead amount is 80 atom % results in approximately C/(A+C)= 0.236.

Note that the present embodiment may be carried out with a modification below.

<Modification>

The modification differs from the first embodiment in that a PTO film is formed between the SrTiO$_3$ film 14 and the PZT film 15 shown in FIG. 1, and other points are the same as the first embodiment. The PTO film is a lead titanate film, and the lead titanate has, for example, an axis length of the a-axis of 0.3904 nm and an axis length of the c-axis of 0.4043 nm.

Also in the modification, the same effect as that of the first embodiment can be obtained.

In the modification, since the PTO film formed between the SrTiO$_3$ film 14 and the PZT film 15 has an axis length that is close to the axis length of each of the a-axis and the c-axis of PZT, the amount or the ratio of the crystal 15a oriented in the c-axis direction 16a in the PZT film 15 can be increased. As the result, piezoelectric properties when the PZT film 15 is used as a piezoelectric element for extracting d31 can be enhanced.

In addition, although the ferroelectric ceramics according to the present embodiment has the film structure as shown in FIG. 1, not all the films shown in FIG. 1 are indispensable, but the present embodiment may be executed by modification of the film structure as follows.

For example, the film structure shown in FIG. 1 may be changed to a film structure in which the Pt film 13 has been removed. In this case, it is preferable to cause the first stacked film 12 to function as an electrode film.

Second Embodiment

Figure 3:
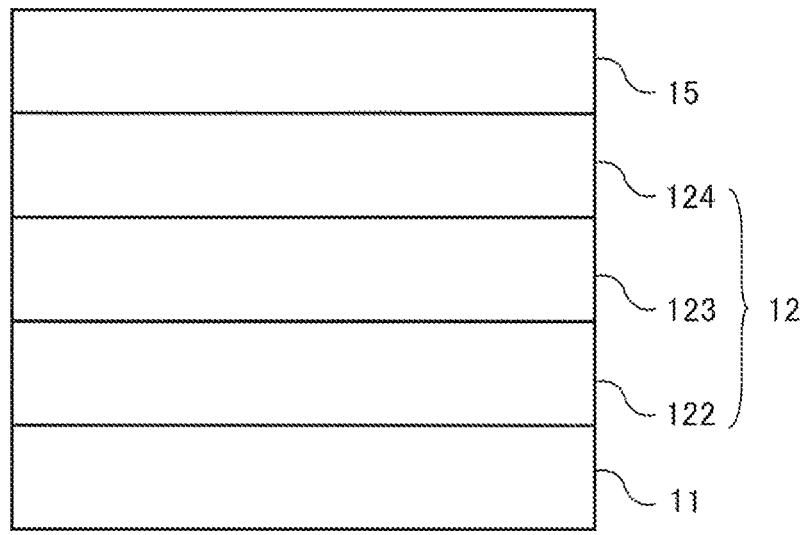
FIG. 3 is a schematic cross-sectional view explaining a manufacturing method of the ferroelectric ceramics according to an aspect of the present invention.
Figure 4:
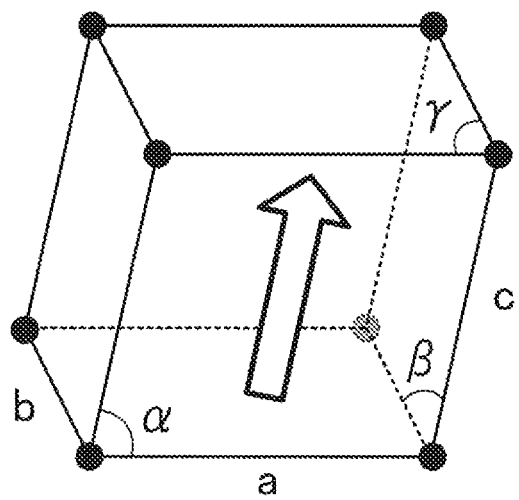
FIG. 4 is a schematic view showing the crystal structure of PZT.

FIG. 3 is a schematic cross-sectional view for explaining a manufacturing method of the ferroelectric ceramics according to an aspect of the present invention.

As shown in FIG. 1, the first stacked film 12 is formed on the Si substrate 11 having the (100) crystal plane. The first stacked film 12 is a film in which a first ZrO$_2$ film 122 and an XO$_Y$ film 123 are formed sequentially and repeatedly N times and a second ZrO$_2$ film 124 is formed on the film formed repeatedly N times. X is Ca, Mg or Hf, Y is 1 or 2, and N is an integer of 1 or more. It is preferable that the ratio of X/(Zr+X) of the first stacked film 12 is less than 33%. Note that a natural oxidation film may be formed on the surface of the Si substrate 11.

Hereinafter, an example of a film formation method of the first stacked film 12 will be explained in detail.

The first ZrO$_2$ film 122 has a thickness of, for example, 3 to 15 nm, and is formed by a reactive evaporation method. An example of film formation conditions at this time is as shown below.

<Formation Conditions of First ZrO$_2$ Film 122>

A (100) Si substrate with a natural oxidation film is previously heated to 800° C. or more in the actual temperature of the substrate, and while blowing previously O$_2$ gas to the Si substrate surface at 10 sccm, electron beams of an acceleration voltage of 7.5 kV and an emission current of 1.7 mA are applied to a Zr metal melting bath to thereby evaporate Zr. This process is carried out for 20 minutes to thereby form a ZrO$_2$ film of 20 nm.

Next, the XO$_Y$ film 123 having a thickness of, for example, 3 to 15 nm is formed on the first ZrO$_2$ film 122 by a reactive evaporation method or a spin coating method.

Subsequently, formations of the first ZrO$_2$ film 122 and the XO$_Y$ film 123 on the XO$_Y$ film 123 are repeated N times (N: an integer of 1 or more). Then, a second ZrO$_2$ film 124 having a thickness of, for example, 3 to 15 nm is formed on the XO$_Y$ film 123 by a reactive evaporation method. The formation conditions at this time are the same as the formation conditions of the first $ZrO_2$ film 122. In this way, there is formed the first stacked film 12 of a sandwich structure being vertically symmetric, in which the first $ZrO_2$ film 122 and the $XO_Y$ film 123 are stacked and the $XO_Y$ film 123 is sandwiched vertically by the $ZrO_2$ film. The first stacked film 12 may become an XSZ film by the thermal diffusion of the first $ZrO_2$ film 122, the $XO_Y$ film 123 and the second $ZrO_2$ film 124.

The first stacked film 12 is oriented in (100) in the same way as the (100) crystal plane of the Si substrate 11. It is preferable that the first stacked film 12 has a thickness of 100 nm or less (preferably 10 nm to 50 nm), and the film is a film having an extremely high single crystallinity.

Subsequently, the PZT film 15 that is an example of a piezoelectric film oriented in the c-axis direction is formed on the second $ZrO_2$ film 124. As the PZT film 15, one that is the same as that of the first embodiment may be used. Note that, in the specification, a "PZT film" may include a substance in which an impurity is contained in $Pb(Zr,Ti)O_3$ and various substances may be incorporated as long as they do not extinguish the function of the piezoelectric body of the PZT film even if the impurity is contained.

Note that the ferroelectric ceramics according to the present embodiment has the film structure as shown in FIG. 3, but the present embodiment may be executed by modification of the film structure as follows.

For example, the third stacked film obtained by stacking the first $ZrO_2$ film and an $Y_2O_3$ film or an yttria-stabilized zirconia (YSZ) film may be formed between the Si substrate 11 and the first stacked film 12, or between the first stacked film 12 and the PZT film 15.

According to the present embodiment, a piezoelectric film having good piezoelectric properties can be obtained by forming the PZT film 15 as a piezoelectric film on the above-described first stacked film 12.

Note that, in the present embodiment, although the first stacked film 12 is formed on the Si substrate 11, an XSZ film (X: Ca or Mg or Hf) may be formed on the Si substrate 11.

Furthermore, the ferroelectric ceramics according to the present embodiment has the film structure as shown in FIG. 1, but the present embodiment may be executed by modification of the film structure as follows.

For example, the third stacked film obtained by stacking a $ZrO_2$ film and an $Y_2O_3$ film or an yttria-stabilized zirconia (YSZ) film may be formed between the Si substrate 11 and the first stacked film 12, or between the first stacked film 12 and the PZT film 15.

Third Embodiment

In the present embodiment, an inspection method of a piezoelectric film will be explained.

When an piezoelectric film is to be used as a piezoelectric element for extracting d31 in which an electric field is applied in the direction perpendicular to a Si substrate surface to thereby be caused to move in the direction parallel to the Si substrate surface, a larger amount of a crystal oriented in the c-axis direction in the piezoelectric film results in enhancing the properties of the piezoelectric element for extracting d31. Accordingly, in order to inspect properties of a piezoelectric film oriented in the c-axis direction, it is necessary to measure the amount of crystals oriented in the c-axis direction.

On the other hand, when inspecting properties of a piezoelectric film for extracting d31 after making a piezoelectric film into a product, generally, properties of the piezoelectric element for extracting d31 are inspected by taking out the piezoelectric film of the product and forming a cantilever by the piezoelectric film. However, in the inspection method, since the piezoelectric film is taken out for a sampling inspection, the sampled product becomes unusable.

The inspection method of a piezoelectric film according to the present embodiment is not a destructive inspection in which the piezoelectric film is taken out, but is a method capable of evaluating properties of the piezoelectric film for extracting d31 by a nondestructive inspection. Hereinafter, the inspection method will be explained in detail.

The PZT film 15 shown in FIG. 1 is irradiated with X-rays by an X-ray diffraction apparatus using a multilayer film mirror, and each of a (004) crystal oriented in the c-axis direction and a (400) crystal oriented in the a-axis direction in the PZT film 15 is measured by the X-ray diffraction (XRD). Then, the amount C of the (004) crystal oriented in the c-axis direction and the amount A of the (400) crystal oriented in the a-axis direction in the PZT film 15 are detected from the measurement result. When the detected result satisfies the formula 1 below, it is possible to determine that the PZT film has excellent properties for extracting d31, but when the result does not satisfy the formula 1 below, it is possible to determine that the PZT film does not have excellent piezoelectric properties for extracting d31.

$$C/(A+C) \geq 0.1 \text{ (preferably, } C/(A+C) \geq 0.20, \text{ more preferably } C/(A+C) \geq 0.25, \text{ further more preferably, } C/(A+C) \geq 0.33) \quad \text{formula 1}$$

The following is the reason why each of the (004) crystal oriented in the c-axis direction and the (400) crystal oriented in the a-axis direction is to be measured. Even when the (001) crystal oriented in the c-axis direction and the (100) crystal oriented in the a-axis direction are measured by X-ray diffraction, the amount of the (001) crystal and the amount of the (100) crystal cannot be detected with high accuracy because peak, positions of both of these (that is, diffraction angles $2\theta$ of both of these) are nearly the same. In contrast, when the (004) crystal oriented in the c-axis direction and the (400) crystal oriented in the a-axis direction are measured by X-ray diffraction using a multilayer film mirror, the amount of the (004) crystal and the amount of the (400) crystal can be detected with high accuracy because peak positions of both of these (that is, diffraction angles $2\theta$ of both of these) are different from each other, and as the result, piezoelectric properties for extracting d31 can be evaluated with high accuracy.

Furthermore, the PZT film 15 shown in FIG. 1 is irradiated with X-rays by an X-ray diffraction apparatus using a multilayer film mirror, and the diffraction based on a (004) component of the crystal oriented in the c-axis direction in the PZT film 15 is measured by the X-ray diffraction. Then, when $2\theta_{004}$ in the result of the XRD satisfies the formula 2 below, it is possible to determine that the PZT film has excellent piezoelectric properties for extracting d31, but when the result does not satisfy the formula 2 below, it is possible to determine that the PZT film does not have excellent piezoelectric properties for extracting d31.

$$95° < 2\theta_{004} < 102° \quad \text{formula 2}$$

Moreover, the PZT film 15 shown in FIG. 1 is irradiated with X-rays by an X-ray diffraction apparatus using a multilayer film mirror, and, by the X-ray diffraction, the diffraction based on a (004) component of the crystal oriented in the c-axis direction in the PZT film 15 is measured by the X-ray diffraction. Then, when the $d_{004}$ value in the result of the XRD satisfies the formula 3 below, it is possible to determine that the PZT film has excellent piezoelectric properties for extracting d31, but when the result does not satisfy the formula 3 below, it is possible to determine that the PZT film does not have excellent piezoelectric properties for extracting d31.

$$0.9919 < d_{004} < 1.0457 \qquad \text{formula 3}$$

Note that above described first to third embodiments and modifications may be performed by appropriately combining them.

DESCRIPTION OF REFERENCE SYMBOLS

11 Si substrate
12 first stacked film
13 Pt film
14 SrTiO$_3$ film
15 PZT film
15a (004) crystal oriented in a c-axis direction
15b (400) crystal oriented in an a-axis direction
16a c-axis direction
16b a-axis direction
122 first ZrO$_2$ film
123 XO$_Y$ film
124 second ZrO$_2$ film

The invention claimed is:

1. A piezoelectric film comprising a crystal oriented in a c-axis direction and a crystal oriented in an a-axis direction, wherein, when denoting an amount of a (004) component of said crystal oriented in the c-axis direction by C and denoting an amount of a (400) component of said crystal oriented in the a-axis direction by A, the piezoelectric film satisfies a formula 1 below, $$C/(A+C) \geq 0.1 \qquad \text{formula 1.}$$

2. The piezoelectric film according to claim 1, wherein 2θ004 in a result of XRD of said (004) component of the crystal oriented in the c-axis direction satisfies a formula 2 below, $$95° < 2θ004 < 102° \qquad \text{formula 2.}$$

3. The piezoelectric film according to claim 1, wherein a d004 value in a result of XRD of said (004) component of the crystal oriented in the c-axis direction satisfies a formula 3 below, $$0.9919 < d004 < 1.0457 \qquad \text{formula 3.}$$

4. The piezoelectric film according to claim 1, wherein said piezoelectric film is a PZT film, and a c-axis length satisfies formula 4 below, $$0.39678 \text{ nm} < c\text{-axis length} < 0.41825 \text{ nm} \qquad \text{formula 4.}$$

5. A ferroelectric ceramics, comprising:
a first stacked film; and
the piezoelectric film according to claim 1 formed on said first stacked film, wherein:
said first stacked film is a film in which a first ZrO2 film and an XOY film are formed sequentially and repeatedly N times and a second ZrO2 film is formed on the film formed repeatedly said N times;
said X is Ca, Mg or Hf;
said Y is 1 or 2; and
said N is an integer of 1 or more.

6. The ferroelectric ceramics according to claim 5, comprising a second stacked film obtained by stacking a SrTiO3 film and a SrRuO3 film, or a SrTiO3 film or a SrRuO3 film, formed between said first stacked film and said piezoelectric film.

7. The ferroelectric ceramics according to claim 6, wherein a lead titanate film is formed between said second stacked film or SrTiO3 film or SrRuO3 film and said piezoelectric film.

8. The ferroelectric ceramics according to claim 5, wherein a second stacked film obtained by stacking a ZrO2 film and an Y2O3 film is formed under said first stacked film, or between said first stacked film and said piezoelectric film.

9. The ferroelectric ceramics according to claim 5, including an electrode film formed between said first stacked film and said piezoelectric film.

10. The ferroelectric ceramics according to claim 9, wherein said electrode film is in contact with said first stacked film.

11. The ferroelectric ceramics according to claim 9, wherein said electrode film includes an oxide or a metal.

12. The ferroelectric ceramics according to claim 9, wherein said electrode film is a Pt film or an Ir film.

13. The ferroelectric ceramics according to claim 5, wherein said first stacked film is formed on a Si substrate.

14. A ferroelectric ceramics comprising:
a first stacked film in which a first ZrO2 film, an Y2O3 film and a second ZrO2 film are stacked sequentially;
a second stacked film obtained by stacking a SrTiO3 film and a SrRuO3 film, or a SrTiO3 film or a SrRuO3 film, formed on said first stacked film; and
a piezoelectric film according to claim 1 formed on said second stacked film or the SrTiO3 film or the SrRuO3 film.

15. The ferroelectric ceramics according to claim 14, comprising an electrode film formed between said first stacked film and said second stacked film or SrTiO3 film or SrRuO3 film.

16. The ferroelectric ceramics according to claim 14, wherein said first stacked film is formed on a Si substrate.

17. An inspection method of a piezoelectric film, comprising the steps of:
measuring each of a (004) component of a crystal oriented in a c-axis direction and a (400) component of a crystal oriented in an a-axis direction of the piezoelectric film by XRD that uses a multilayer film mirror;
detecting an amount C of said (004) component and an amount A of said (400) component from said measurement result; and
determining from said detection result that the piezoelectric film has excellent piezoelectric properties when a formula 1 below is satisfied, or that the piezoelectric film does not have excellent piezoelectric properties when the formula 1 below is not satisfied, $$C/(A+C) \geq 0.1 \qquad \text{formula 1.}$$

18. The inspection method of a piezoelectric film according to claim 17, wherein the formula 1 is satisfied; and
wherein the method determines that the piezoelectric film has excellent piezoelectric properties when 2θ004 in a result of XRD of said (004) component of the crystal oriented in the c-axis direction satisfies a formula 2 below, or that the piezoelectric film does not have excellent piezoelectric properties when 2θ004 does not satisfy the formula 2 below, $$95° < 2θ004 < 102° \qquad \text{formula 2.}$$

19. The inspection method of a piezoelectric film according to claim 17, wherein the formula 1 is satisfied; and
wherein the method determines that the piezoelectric film has excellent piezoelectric properties when a d004 value in a result of XRD of said (004) component of the crystal oriented in the c-axis direction satisfies a formula 3 below, or that the piezoelectric film does not have excellent piezoelectric properties when a d004 value does not satisfy the formula 3 below, $0.9919 < d004 < 1.0457$ formula 3.

20. The inspection method of a piezoelectric film according to claim 17, wherein the formula 1 is satisfied; and wherein said piezoelectric film is a PZT film, and the method determines that the piezoelectric film has excellent piezoelectric properties when a c-axis length satisfies a formula 4 below, or that the piezoelectric film does not have excellent piezoelectric properties when a c-axis length does not satisfy the formula 4 below, $0.39678 \text{ nm} < c\text{-axis length} < 0.41825 \text{ nm}$ formula.

* * * * *